(12) United States Patent
Nakata

(10) Patent No.: US 11,508,698 B2
(45) Date of Patent: Nov. 22, 2022

(54) SEMICONDUCTOR PACKAGE AND SEMICONDUCTOR DEVICE

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/348,892

(22) Filed: Jun. 16, 2021

(65) Prior Publication Data

US 2022/0084990 A1   Mar. 17, 2022

(30) Foreign Application Priority Data

Sep. 15, 2020  (JP) .............................. JP2020-154536

(51) Int. Cl.
| | | |
|---|---|---|
| *H01L 25/07* | (2006.01) | |
| *H01L 23/492* | (2006.01) | |
| *H01L 23/538* | (2006.01) | |
| *H01L 23/31* | (2006.01) | |
| *H01L 23/498* | (2006.01) | |
| *H01L 23/16* | (2006.01) | |

(52) U.S. Cl.
CPC ............ *H01L 25/072* (2013.01); *H01L 23/16* (2013.01); *H01L 23/3121* (2013.01); *H01L 23/492* (2013.01); *H01L 23/49844* (2013.01); *H01L 23/5386* (2013.01)

(58) Field of Classification Search
CPC ... H01L 25/072; H01L 23/16; H01L 23/3121; H01L 23/492; H01L 23/49844; H01L 23/5386
See application file for complete search history.

(56) References Cited

U.S. PATENT DOCUMENTS

| | | | |
|---|---|---|---|
| 2012/0038276 A1 | 2/2012 | Nakamura | |
| 2013/0286617 A1* | 10/2013 | Shibasaki | H01L 23/49811 361/772 |

FOREIGN PATENT DOCUMENTS

WO   2010/110170 A1   9/2010

\* cited by examiner

*Primary Examiner* — Peniel M Gumedzoe
(74) *Attorney, Agent, or Firm* — Studebaker & Brackett PC

(57) ABSTRACT

Each of a plurality of semiconductor elements included in a semiconductor package includes a front-surface electrode being provided on a semiconductor substrate on a side opposite to a conductor substrate, a back-surface electrode being joined to the conductor substrate, a control pad configured to control current flowing between the front-surface electrode and the back-surface electrode, a frame being electrically connected to the front-surface electrode, a portion of the frame being exposed from a surface of a sealing material from which a lower surface of the conductor substrate is exposed, and a plurality of terminal blocks being electrically connected to a plurality of first pads, a portion of the plurality of terminal blocks being exposed from a surface of the sealing material, the surface being provided on a side opposite to the surface of the sealing material from which the lower surface of the conductor substrate is exposed.

8 Claims, 9 Drawing Sheets

F I G. 2
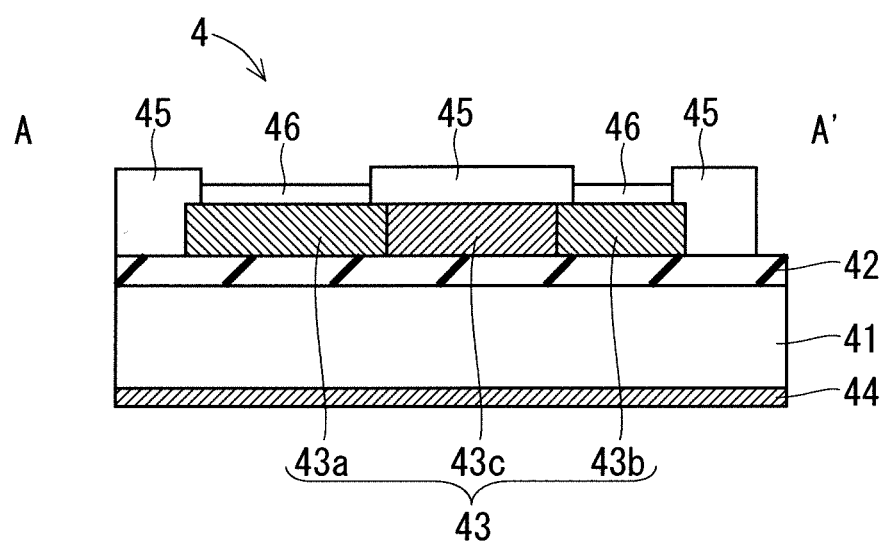

F I G. 5
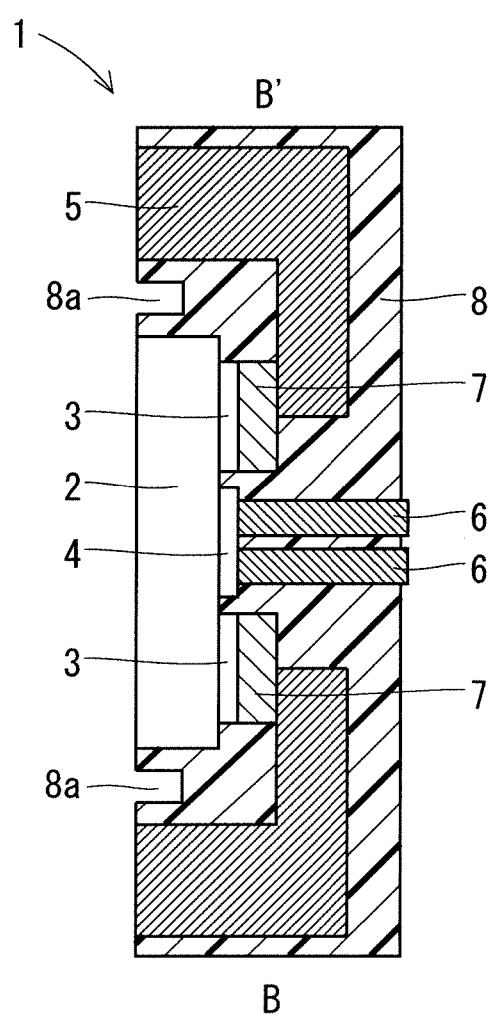

F I G. 8
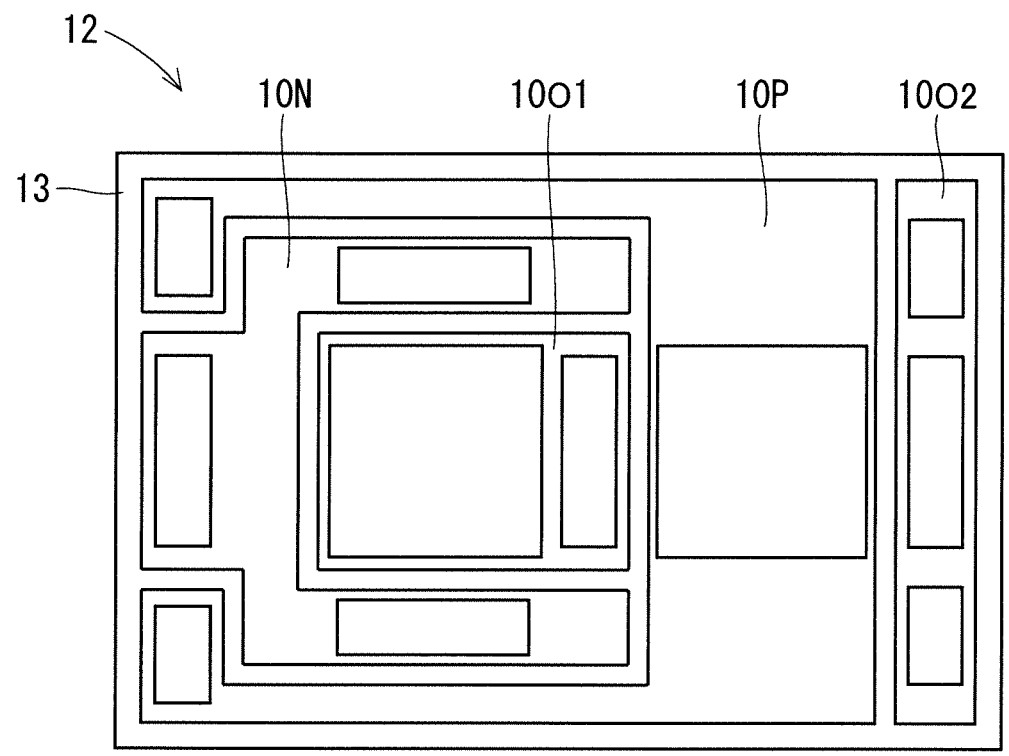

SEMICONDUCTOR PACKAGE AND SEMICONDUCTOR DEVICE

BACKGROUND OF THE INVENTION

Field of the Invention

The present disclosure relates to a semiconductor package and a semiconductor device.

Description of the Background Art

WO 2010/110170 A1 discloses a semiconductor device having a configuration in which a plurality of semiconductor elements and a wiring element are sealed with resin to be integrated with each other.

In the semiconductor device described in WO 2010/110170 A1, for example, an external connection member, such as wire bonding or a lead frame, is required to be provided in order to connect a source electrode to an external circuit. Further, when the wiring element is provided at the center of the semiconductor device, a connection member of a control terminal and a connection member for main current interfere with each other, and thus there is a problem in that layout is limited.

SUMMARY

The technology of the present disclosure has an object to enhance a degree of freedom of layout and easiness of assembly in a semiconductor package in which a plurality of semiconductor elements and a wiring element are sealed with resin to be integrated with each other.

A semiconductor package according to the present disclosure includes a conductor substrate, a plurality of semiconductor elements, at least one wiring element, a sealing material, a frame, and a plurality of terminal blocks. The plurality of semiconductor elements are joined to an upper surface of the conductor substrate, and have a switching function. The at least one wiring element is joined to the upper surface of the conductor substrate. The number of the at least one wiring element is less than the number of the plurality of semiconductor elements. The sealing material seals a portion of the conductor substrate except for a lower surface, the plurality of semiconductor elements, and the wiring element. Each of the plurality of semiconductor elements includes a first substrate, a first main electrode part, a second main electrode part, and a control pad. The first main electrode part is provided on the first substrate on a side opposite to the conductor substrate. The second main electrode part is provided on the first substrate on a side of the conductor substrate, and is joined to the conductor substrate. The control pad is configured to control current flowing between the first main electrode part and the second main electrode part. The wiring element includes a second substrate, a plurality of first pads, and a plurality of second pads. The plurality of first pads are provided on the second substrate on the side opposite to the conductor substrate. The plurality of second pads are provided on the second substrate on the side opposite to the conductor substrate, are electrically connected to the plurality of first pads, and are connected to the control pad with a wire. The frame is electrically connected to the first main electrode part of each of the plurality of semiconductor elements, and a portion of the frame is exposed from a surface of the sealing material from which the lower surface of the conductor substrate is exposed. The plurality of terminal blocks are electrically connected to the plurality of first pads, and a portion of the plurality of terminal blocks is exposed from a surface of the sealing material on a side opposite to the surface from which the lower surface of the conductor substrate is exposed.

According to the semiconductor package of the present disclosure, both of the conductor substrate and the frame serving as the main current path of the semiconductor element are exposed from one surface of the sealing material. Accordingly, by performing connection of the second pad of the wiring element serving as a control terminal of the semiconductor element on the other surface of the sealing material, interference between the main current path and the wiring can be less liable to be caused. Therefore, the degree of freedom of layout of the wiring element is enhanced. Further, because the semiconductor package according to the present disclosure incorporates the frame serving as the main current path, a separate connection member is not required for the sake of connection with an external circuit of the semiconductor package, and connection can thus be easily performed. Consequently, according to the semiconductor package of the present disclosure, the semiconductor device can be easily assembled.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a cross-sectional view taken along the line A-A' of FIG. 1.

FIG. 5 is a cross-sectional view of the semiconductor package according to the first embodiment taken along the line B-B' of FIG. 3.

FIG. 8 is a top view of an insulation substrate.

DESCRIPTION OF THE PREFERRED EMBODIMENTS

1. First Embodiment

1.1 Introduction

Figure 1:
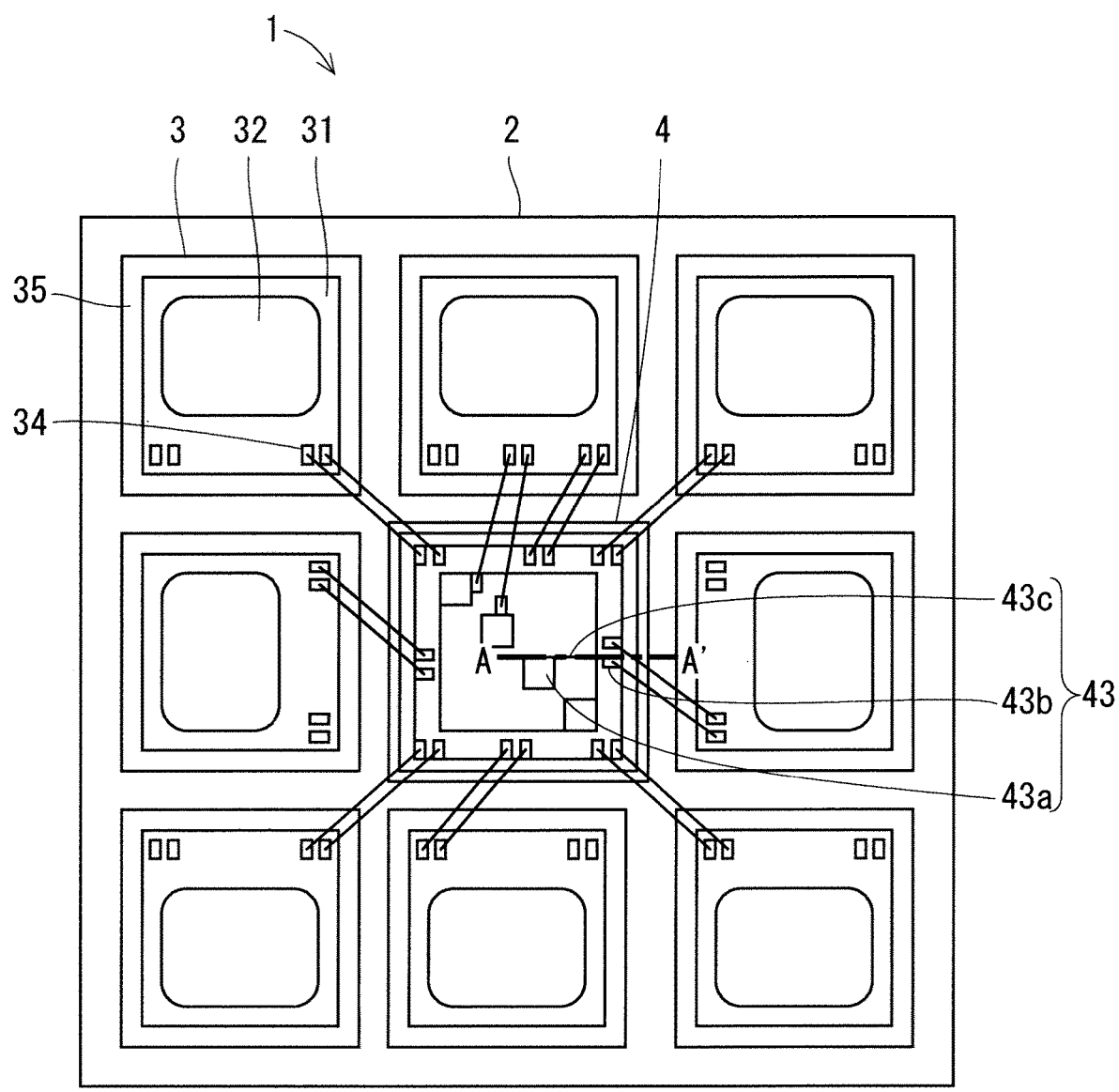
FIG. 1 is a diagram illustrating disposition of semiconductor elements and a wiring element on a conductor substrate.

FIG. 1 is a schematic view illustrating a semiconductor package 1 according to the first embodiment. Note that a frame 5, a plurality of terminal blocks 6, a spacer conductor 7, and a sealing material 8 that are included in the semiconductor package 1 are omitted from illustration of FIG. 1 for the sake of convenience of illustration, and are illustrated in FIG. 3 to FIG. 6.

As illustrated in FIG. 1, the semiconductor package 1 includes a conductor substrate 2, a plurality of semiconductor elements 3, and a wiring element 4. It is only necessary that the number of semiconductor elements 3 be two or more. Further, it is only necessary that the number of wiring elements 4 be less than the number of semiconductor elements 3. FIG. 1 illustrates the semiconductor package 1 that includes eight semiconductor elements 3 and one wiring element 4, and the following description will describe this semiconductor package 1.

Each semiconductor element 3 is joined to the upper surface of the conductor substrate 2, and is electrically and thermally connected to the conductor substrate 2. The wiring element 4 is also joined to the upper surface of the conductor substrate 2, and is electrically and thermally connected to the conductor substrate 2, similarly to each semiconductor element 3. In the example of FIG. 1, the eight semiconductor elements 3 are disposed to surround the wiring element 4 in plan view.

1.2 Semiconductor Elements

Each semiconductor element 3 is an element having a switching function, and is, for example, a MOSFET that contains SiC as a semiconductor material (the MOSFET is hereinafter referred to as an "SiC-MOSFET"). Note that each semiconductor element 3 may be a semiconductor element that contains a material other than SiC, such as Si, as a semiconductor material. Further, each semiconductor element 3 may be a semiconductor element other than the MOSFET, such as an insulated gate bipolar transistor (IGBT).

As illustrated in FIG. 1, each semiconductor element 3 includes a semiconductor substrate 31 being a first substrate, a front-surface electrode 32, a back-surface electrode (not illustrated), one or a plurality of control pads 34, and a pressure-resistant structure 35.

The front-surface electrode 32 being a first main electrode part is provided on qthe front surface of the semiconductor substrate 31, which is a surface of the semiconductor substrate 31 on a side opposite to the conductor substrate 2. The front-surface electrode 32 corresponds to a source electrode of the MOSFET.

The back-surface electrode (not illustrated) being a second main electrode part is provided on the back surface of the semiconductor substrate 31, which is a surface of the semiconductor substrate 31 on a side of the conductor substrate 2, and is joined to the conductor substrate 2. In this manner, the potential of the back-surface electrode of each semiconductor element 3 is equal to each other. The back-surface electrode corresponds to a drain electrode of the MOSFET.

The control pads 34 are each a pad for controlling current flowing between the front-surface electrode 32 and the back-surface electrode. The control pad 34 corresponds to a gate electrode of the MOSFET.

The front-surface electrode 32, the back-surface electrode, and the control pads 34 include a film made of Ni, Cu, Au, or Ag, for example, that can be connected with sintering. The front-surface electrode 32, the back-surface electrode, and the control pads 34 may be a stacking structure of the electrode material made of Al or the like and the film that can be connected with sintering disposed above the electrode material.

1.3 Wiring Element

FIG. 2 is a cross-sectional view taken along the line A-A' of FIG. 1. Note that, in FIG. 2, illustration of the conductor substrate 2 is omitted. As illustrated in FIG. 2, the wiring element 4 includes a wiring substrate 41 being a second substrate, an insulation film 42, a plurality of connection wires 43, a metal film 44, and a protective film 45.

The wiring substrate 41 is made of Si, for example.

The plurality of connection wires 43 are provided above the front surface of the wiring substrate 41, which is a surface of the wiring substrate 41 on a side opposite to the conductor substrate 2, with the insulation film 42 being interposed between the plurality of connection wires 43 and the front surface. Each connection wire 43 includes a first pad 43a, a second pad 43b, and a leading part 43c. The first pad 43a and the second pad 43b are electrically connected to each other by the leading part 43c.

The plurality of connection wires 43 are electrode patterns made of Al, for example. A film 46 made of Ni, Cu, Au, or Ag, for example, that can be connected with sintering may be formed at least on the first pad 43a of the plurality of connection wires 43. As necessary, the film 46 that can be connected with sintering may be formed on the second pad 43b or the leading part 43c. Further, each connection wire 43 itself may be made of a material that can be connected with sintering.

The metal film 44 is provided on the back surface of the wiring substrate 41, which is a surface of the wiring substrate 41 on a side of the conductor substrate 2, and is joined to the conductor substrate 2. In other words, the metal film 44 is a film for joining with the conductor substrate 2.

The protective film 45 covers at least a portion of the insulation film 42 and at least a portion of the connection wires 43. The first pad 43a and the second pad 43b are exposed from the protective film 45.

1.4 Connection of Wiring Element with Semiconductor Elements

The control pads 34 of each semiconductor element 3 are electrically connected to the second pad 43b of the wiring element 4. For this connection, a fine wire made of Au or Ag or a wire made of Al may be used.

The back-surface electrode of each semiconductor element 3 and the metal film 44 of the wiring element 4 are both connected to the conductor substrate 2.

The front-surface electrode 32 of each semiconductor element 3 is connected to the frame 5 (see FIG. 3 to FIG. 6).

The terminal blocks 6 are connected to the first pad 43a of the wiring element 4.

Sintering joining can be used for joining between the back-surface electrode of each semiconductor element 3 and the conductor substrate 2, joining between the metal film 44 and the conductor substrate 2, joining between the front-surface electrode 32 and the frame 5, and connection between the first pad 43a and the terminal blocks 6. A joining material used for sintering joining is made of Ag or Cu, for example. The joining material forms connection through a pressure joining process, a non-pressure joining process, or the like.

The pressure-resistant structure 35 is provided around the front-surface electrode 32 in the upper surface of each semiconductor element 3, and the end portion of the semiconductor element 3 serves as drain potential. Thus, certain insulation spacing is necessary to insulate the end portion of the semiconductor element 3 from the frame 5. In view of this, in order to secure the spacing between the end portion of the semiconductor element 3 and the frame 5, the front-surface electrode 32 may be connected to the frame 5 through the spacer conductor 7 (see FIG. 5). The spacer conductor 7 may be a component that is integrally formed with the frame 5, or may be a separate component that is connected to the frame 5 using a joining material.

1.5 Sealing

The plurality of semiconductor elements 3, the one or plurality of wiring elements 4, at least a portion of the conductor substrate 2, at least a portion of the frame 5, and at least a portion of the plurality of terminal blocks 6 are sealed by the sealing material 8.

FIG. 3 to FIG. 6 are diagrams illustrating the semiconductor package 1 including the frame 5 and the sealing material 8.

Figure 3:
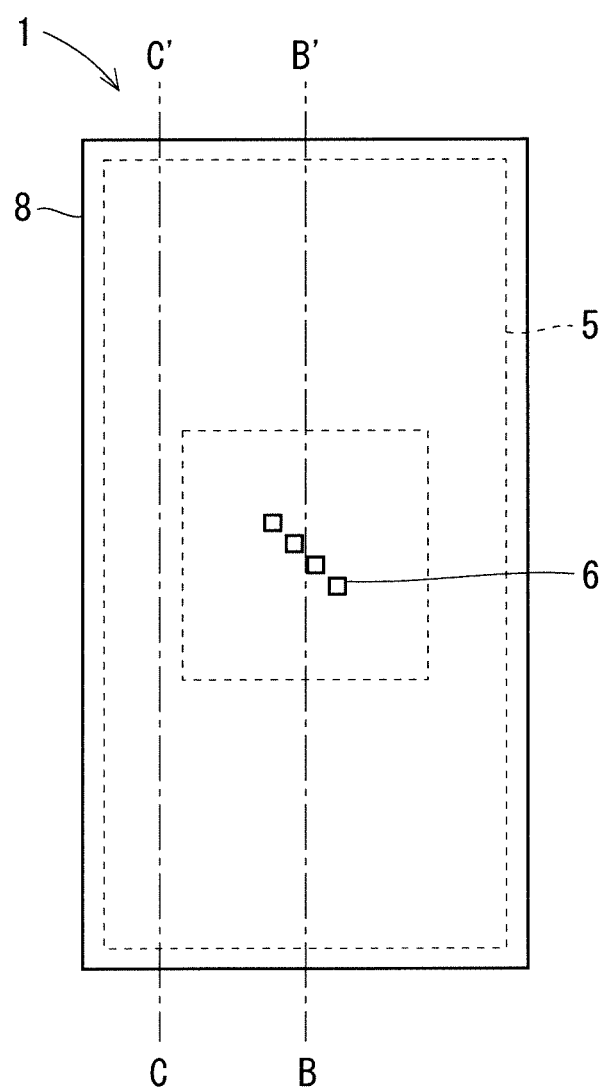
FIG. 3 is a plan view of a semiconductor package according to the first embodiment as seen from top.

FIG. 3 is a plan view of the semiconductor package 1 as seen from the front side. As illustrated in FIG. 3, the frame 5 has an opening at its center portion in plan view. The opening of the frame 5 overlaps the wiring element 4. Owing to this configuration, the frame 5 is not connected to the wiring element 4 (see FIG. 5). In addition, the opening of the frame 5 may reach the upper portion of the control pads 34 of the semiconductor element 3 to be connected to the wiring element 4. In this case, the frame 5 can be provided without consideration of the height of a wire of wire bonding for connecting the wiring element 4 and the control pads 34. Further, as illustrated in FIG. 3, a portion of the terminal blocks 6 connected to the first pad 43a of the wiring element 4 is exposed from the upper surface of the sealing material 8.

Figure 4:
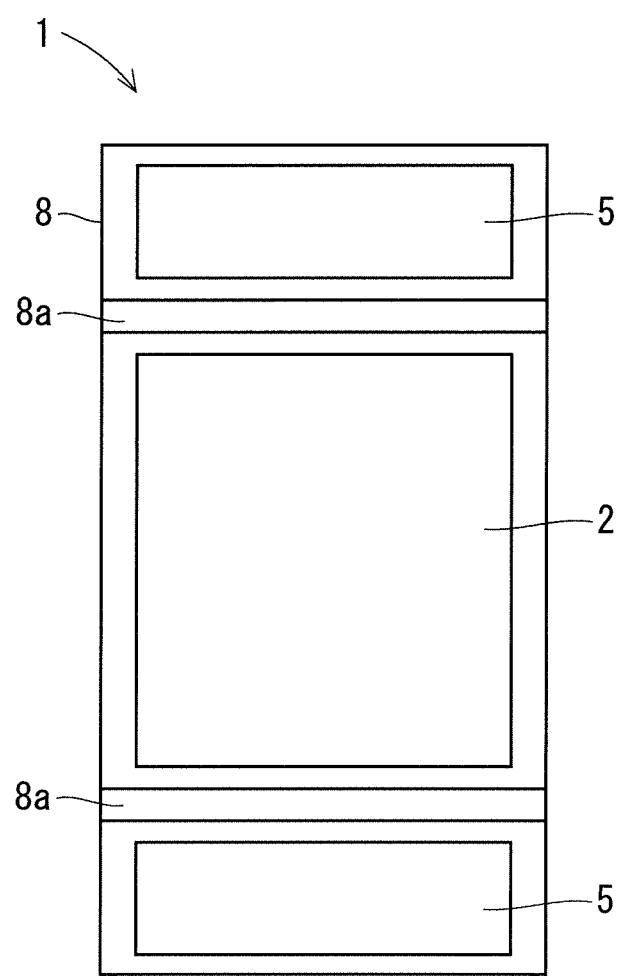
FIG. 4 is a plan view of the semiconductor package according to the first embodiment as seen from below.
Figure 6:
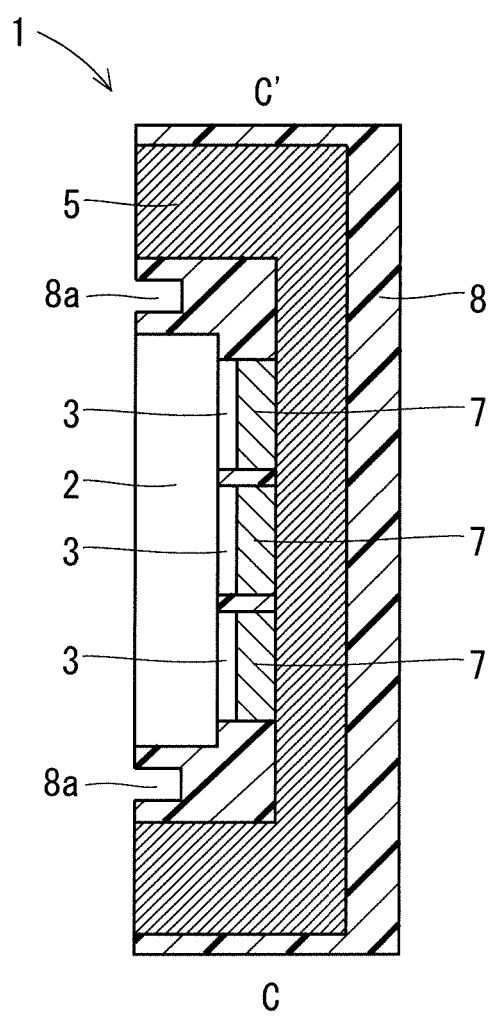
FIG. 6 is a cross-sectional view of the semiconductor package according to the first embodiment taken along the line C-C' of FIG. 3.

FIG. 4 is a plan view of the semiconductor package 1 as seen from the back side. FIG. 5 is a cross-sectional view of the semiconductor package 1 taken along the line B-B' of FIG. 3. FIG. 6 is a cross-sectional view of the semiconductor package 1 taken along the line C-C' of FIG. 3. As illustrated in FIG. 4 to FIG. 6, the lower surface of the conductor substrate 2 and at least two portions of the frame 5 are exposed from the lower surface of the sealing material 8. Note that, in FIG. 5, illustration of wires is omitted for the sake of convenience of illustration.

As illustrated in FIG. 5 and FIG. 6, the two exposed portions of the frame 5 exposed from the lower surface of the sealing material 8 face each other, with the lower surface of the conductor substrate 2 exposed from the same lower surface of the sealing material 8 being interposed between the two exposed portions.

As illustrated in FIG. 5 and FIG. 6, a surface creepage structure 8a for securing insulation spacing between the conductor substrate 2 and the frame 5 is provided between the lower surface of the conductor substrate 2 exposed from the sealing material 8 and the exposed portions of the frame 5 exposed from the sealing material 8. In FIG. 5 and FIG. 6, the surface creepage structure 8a is a recessed portion of the sealing material 8.

Figure 7:
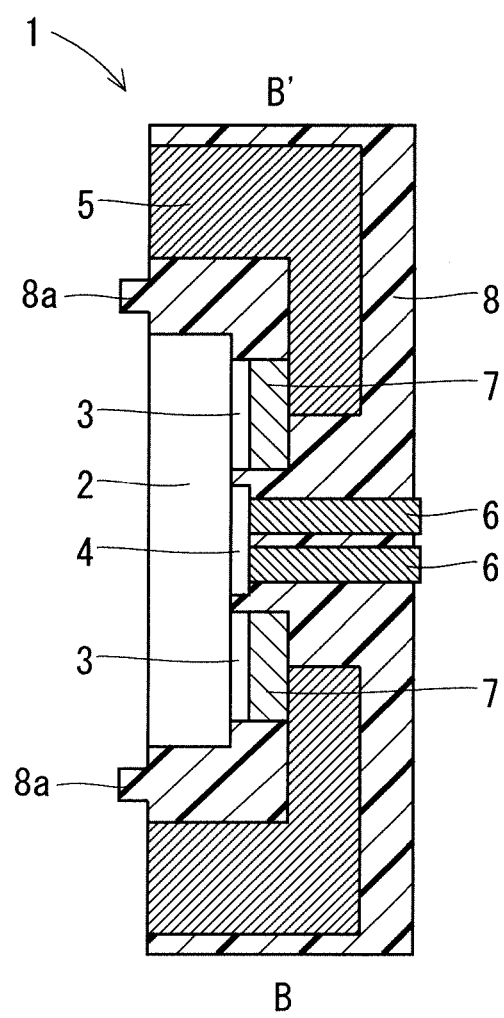
FIG. 7 is a cross-sectional view of the semiconductor package according to a modification of the first embodiment in similar cross-section taken along the line B-B' of FIG. 3.

As illustrated in FIG. 7, the surface creepage structure 8a may be a projecting portion of the sealing material 8. The surface creepage structure 8a illustrated in FIG. 5 or FIG. 7 is formed by using a die used in a sealing process of the semiconductor package by means of transfer molding. Provided that the surface creepage structure 8a is a projecting portion of the sealing material 8 as illustrated in FIG. 7, at the time when the semiconductor package 1 is joined to an insulation substrate 12 to be described later, the surface creepage structure 8a being disposed at a position to overlap a gap between circuit patterns can allow the surface creepage structure 8a to be used as a positioning component of the semiconductor package 1 with respect to the circuit patterns.

Note that, in FIG. 7, illustration of wires is omitted for the sake of convenience of illustration.

1.6 Semiconductor Device

FIG. 8 is a top view of the insulation substrate 12. The insulation substrate 12 includes an insulation base material 13, and a plurality of circuit patterns 10N, 10P, 10O1, and 10O2 that are provided apart from each other on the upper surface of the insulation base material 13.

When a plurality of semiconductor packages 1 are electrically and thermally connected to the circuit patterns 10N, 10P, 10O1, and 10O2 of the insulation substrate 12, a semiconductor device 11 is formed. For connection between the circuit patterns 10N, 10P, 10O1, and 10O2 and each semiconductor package 1, solder joining or sintering joining may be used.

Figure 9:
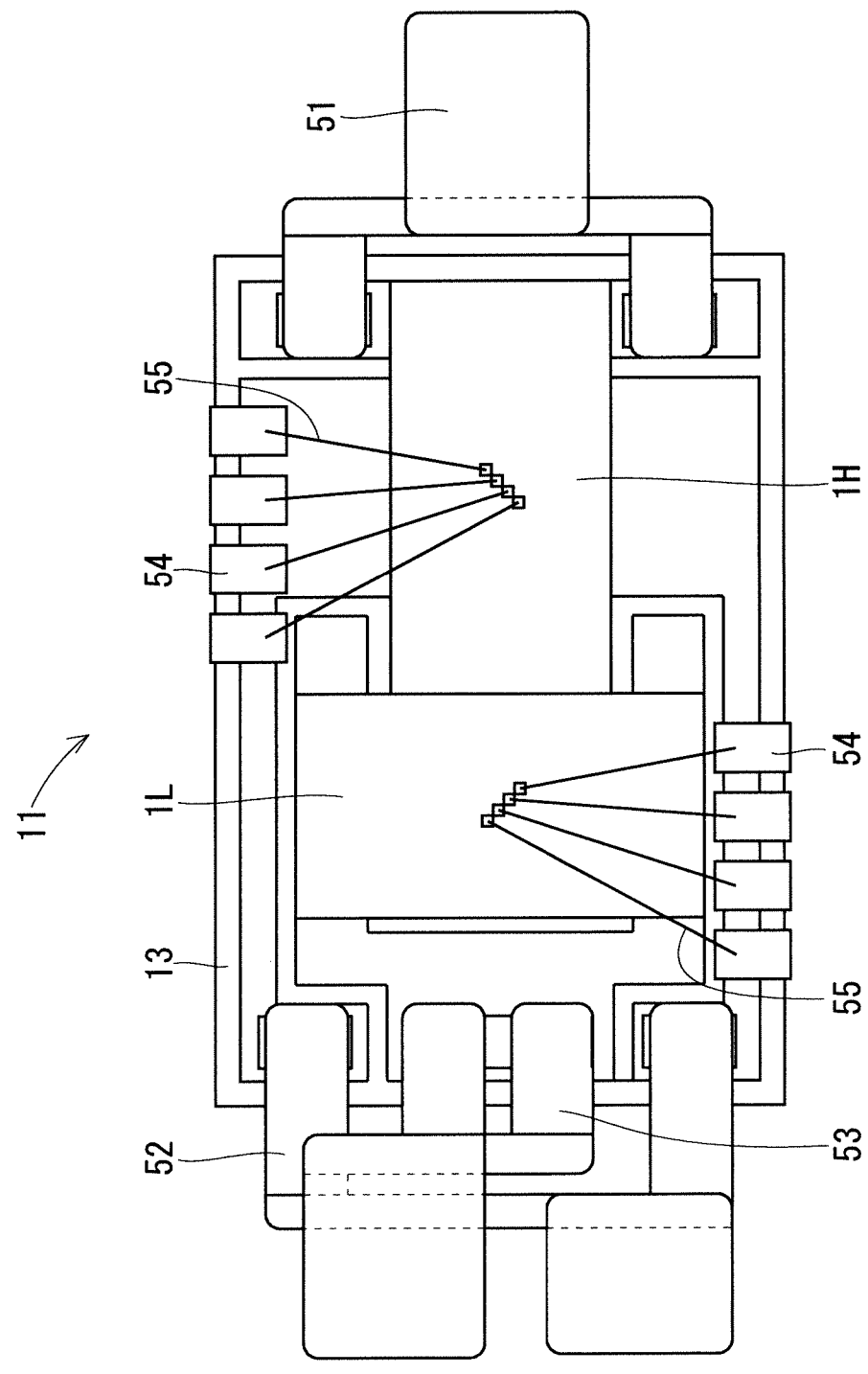
FIG. 9 is a top view of a semiconductor device according to the first embodiment.

FIG. 9 is a top view of the semiconductor device 11 including two semiconductor packages 1. The semiconductor device 11 forms a half-bridge circuit, and one semiconductor package 1 is used for each of the upper arm and the lower arm. Note that a plurality of semiconductor packages 1 may be used for the upper arm or the lower arm.

In FIG. 9, a semiconductor package for the upper arm is represented by a semiconductor package 1H, and a semiconductor package for the lower arm is represented by a semiconductor package 1L.

The circuit pattern 10P and the circuit pattern 10N respectively correspond to P potential and N potential of the semiconductor device 11. Further, the circuit patterns 10O1 and 10O2 correspond to output potential of the semiconductor device 11. The circuit patterns 10O1 and 10O2 are disposed at positions to face each other, with the circuit pattern 10P being interposed between the circuit patterns 10O1 and 10O2.

As illustrated in FIG. 5 to FIG. 7, at least two portions of the frame 5 and the conductor substrate 2 are exposed from the back surface of the semiconductor package 1. In the semiconductor package 1H of the upper arm, the lower surface of the conductor substrate 2 is connected to the circuit pattern 10P, one exposed portion of the frame 5 is connected to the circuit pattern 10O2, and the other exposed portion is connected to the circuit pattern 10O1. Specifically, the other exposed portion of the frame 5 in the semiconductor package 1H of the upper arm is connected to the circuit pattern 10O1 to which the conductor substrate 2 is connected in the semiconductor package 1L of the lower arm.

An output terminal 51 for extracting current from the semiconductor device 11 is connected to the circuit pattern 10O2. A P main electrode 52 is connected to the circuit pattern 10P, and an N main electrode 53 is connected to the circuit pattern 10N. The P main electrode 52 and the N main electrode 53 are connected to an external capacitor module or the like.

In the semiconductor package 1L of the lower arm, the conductor substrate 2 is connected to the circuit pattern 10O1, and two exposed portions of the frame 5 are connected to the circuit pattern 10N.

In the semiconductor package 1L of the lower arm as well, similarly to semiconductor package 1H, the frame 5 is exposed from the sealing material 8 at two portions, and thus the circuit pattern 10N is disposed by branching at positions corresponding to each of the exposed portions of the frame 5.

The semiconductor package 1H of the upper arm is disposed on a side of the output terminal 51, and the semiconductor package 1L of the lower arm is disposed on a side of the P main electrode 52 and the N main electrode 53. The semiconductor package 1H of the upper arm and the semiconductor package 1L of the lower arm are disposed in such directions that the semiconductor package 1H and the semiconductor package 1L are disposed substantially at a right angle.

The planar shape of the semiconductor package 1 is a rectangular shape. The plurality of terminal blocks 6 are arrayed in an oblique direction with respect to sides of an outer shape of the semiconductor package 1 in plan view.

The terminal blocks 6 are electrically connected to external signal terminals 54 with wires 55. A control signal input to the external signal terminals 54 is transmitted to the semiconductor elements 3 via the terminal blocks 6 and the connection wires 43 of the wiring element 4. This causes the semiconductor package 1 to be driven and a circuit of the semiconductor device 11 to operate. Note that joining between the external signal terminals 54 and the terminal blocks 6 may be direct joining not using wires.

1.7 Effects

The conductor substrate 2 connected to the back-surface electrode of the semiconductor element 3 and the frame 5 connected to the front-surface electrode 32 of each semiconductor element 3 are exposed from the lower surface of the semiconductor package 1. Only the terminal blocks 6 are exposed from the upper surface of the semiconductor package 1. This eliminates the need of providing wiring connection with large current capacity for dealing with main current, thus allowing for configuration of the semiconductor device 11 with a simple connection method.

In the semiconductor package 1, the frame 5 serving as a main current path is included in the sealing material 8 except for its exposed portions. Therefore, the main electrode need not be connected by using an external wiring material. Further, the back surface and the front surface of each semiconductor element 3 can be connected to the circuit patterns through one die bonding process. Therefore, manufacturing processes of the semiconductor device 11 are reduced. When the semiconductor device 11 of a large circuit scale is assembled, members having large dimensions are used, and thus tolerance may be large. However, because the semiconductor package 1 incorporates the frame 5, tolerance is small. Accordingly, the semiconductor device 11 with high manufacturability and reliability can be stably manufactured.

Further, the circuit patterns can be brought as close to each other as possible, and thus parasitic inductance of the semiconductor device 11 can be reduced to as small as possible. Accordingly, ringing that occurs when the SiC-MOSFET is used for the semiconductor elements 3 can be reduced.

The terminal blocks 6 are connected to the external signal terminals 54 with a small number of wires. Alternatively, the terminal blocks 6 are directly connected to the external signal terminals 54 by using solder or the like. In any case, connection between the terminal blocks 6 and the external signal terminals 54 is performed on the upper surface side of the semiconductor package 1, which causes no interference with main current circuit patterns on the lower surface side of the semiconductor package 1. Accordingly, the degree of freedom of layout and the yield are enhanced. As a result, the semiconductor device 11 can be configured with simple assembling, and thus manufacturing costs are reduced.

In the semiconductor device 11 illustrated in FIG. 9, the use of the semiconductor package 1 leads to enhancement of the degree of freedom of the circuit patterns and the layout, and thus Ls can be reduced and a space can be reduced.

Further, with the semiconductor package 1H of the upper arm and the semiconductor package 1L of the lower arm being disposed substantially at a right angle, the circuit patterns can have wiring of the same length, and thus reduction of Ls can be implemented and imbalance operation can be less liable to be caused.

Further, with the plurality of terminal blocks 6 being arrayed obliquely with respect to sides of the semiconductor package 1, even when the semiconductor package 1H of the upper arm and the semiconductor package 1L of the lower arm are disposed substantially at a right angle, the following two effects can be achieved.

The first effect is that wires less interfere with each other when the terminal blocks 6 and the external signal terminals 54 are joined with wire bonding.

The second effect is that the array of the external signal terminals 54 with respect to the semiconductor package 1H of the upper arm and the array of the external signal terminals 54 with respect to the semiconductor package 1L of the lower arm can be made parallel with each other. In this manner, easiness of assembly of the control substrate with respect to the external signal terminals 54 is secured.

Accordingly, the angle formed between a disposition direction of the semiconductor package 1H of the upper arm and a disposition direction of the semiconductor package 1L of the lower arm may be shifted from the precise right angle in so far as the above-described two effects are exerted. "Substantially" in "substantially at a right angle" in the above is used in a sense of allowing such tolerance.

When the surface creepage structure 8a is formed by using a portion of the sealing material 8, not only the creepage distance can be secured without additional costs incurred due to provision of the surface creepage structure 8a, but the semiconductor package 1 can be downsized as well. Provided that the surface creepage structure 8a is a projecting portion of a portion of the sealing material 8, if the surface creepage structure 8a is designed to enter a gap between the circuit patterns, the surface creepage structure 8a can be utilized as a component of self-alignment, and thus manufacturability of the semiconductor device 11 can be enhanced.

Note that each embodiment can be freely combined, and each embodiment can be modified or omitted as appropriate.

While the disclosure has been shown and described in detail, the foregoing description is in all aspects illustrative and not restrictive. It is therefore understood that numerous modifications and variations can be devised.

What is claimed is:

1. A semiconductor package comprising:
 a conductor substrate;
 a plurality of semiconductor elements having a switching function and being joined to an upper surface of the conductor substrate;
 at least one wiring element being joined to the upper surface of the conductor substrate, a number of the at least one wiring element being less than a number of the plurality of semiconductor elements; and
 a sealing material sealing a portion of the conductor substrate except for a lower surface of the conductor substrate, the plurality of semiconductor elements, and the at least one wiring element, wherein
 each of the plurality of semiconductor elements includes a first substrate, a first main electrode part being provided on the first substrate on a side opposite to the conductor substrate, a second main electrode part being provided on a side of the conductor substrate of the first substrate, and being joined to the conductor substrate, and a control pad configured to control current flowing between the first main electrode part and the second main electrode part, the wiring element includes a second substrate, a plurality of first pads being provided on the second substrate on the side opposite to the conductor substrate, and a plurality of second pads being provided on the second substrate on the side opposite to the conductor substrate, being electrically connected to the plurality of first pads, and being connected to the control pad with a wire, and the semiconductor package further comprises:

a frame being electrically connected to the first main electrode part of each of the plurality of semiconductor elements, a portion of the frame being exposed from a surface of the sealing material from which the lower surface of the conductor substrate is exposed; and a plurality of terminal blocks being electrically connected to the plurality of first pads, a portion of the plurality of terminal blocks being exposed from a surface of the sealing material, the surface being provided on a side opposite to the surface of the sealing material from which the lower surface of the conductor substrate is exposed.

2. The semiconductor package according to claim 1, further comprising a surface creepage structure having a projecting shape or a recessed shape between the lower surface of the conductor substrate exposed from the sealing material and the exposed portion of the frame being exposed from the sealing material.

3. A semiconductor device comprising:

at least one semiconductor package according to claim 1; and an insulation substrate to which the at least one semiconductor package is joined, wherein the insulation substrate includes an insulation base material, and a plurality of circuit patterns provided apart from each other on an upper surface of the insulation base material, and the plurality of circuit patterns are connected to the lower surface of the conductor substrate exposed from the sealing material and the exposed portion of the frame exposed from the sealing material.

4. The semiconductor device according to claim 3, wherein the at least one semiconductor package includes a surface creepage structure having a projecting shape being a portion of the sealing material between the lower surface of the conductor substrate exposed from the sealing material and the exposed portion of the frame exposed from the sealing material, and the surface creepage structure overlaps a gap between the plurality of circuit patterns when the at least one semiconductor package is joined to the insulation substrate.

5. The semiconductor device according to claim 3, wherein the at least one semiconductor package configures each of an upper arm and a lower arm of a half-bridge circuit, and in each of the at least one semiconductor package, at least two portions of the frame are exposed from the sealing material.

6. The semiconductor device according to claim 5, wherein in each of the at least one semiconductor package, the two exposed portions of the frame exposed from the sealing material face each other in plan view, with the lower surface of the conductor substrate exposed from the sealing material being interposed between the two exposed portions, the two exposed portions of the frame exposed from the sealing material in the at least one semiconductor package constituting the lower arm are connected to one of the plurality of circuit patterns corresponding to an N main electrode, and one of the two exposed portions of the frame exposed from the sealing material in the at least one semiconductor package constituting the upper arm is connected to an output terminal of the semiconductor device, and another is connected to another one of the plurality of circuit patterns to which the conductor substrate of the at least one semiconductor package constituting the lower arm is connected.

7. The semiconductor device according to claim 6, wherein the at least one semiconductor package constituting the upper arm is disposed substantially at a right angle to a disposition direction of the at least one semiconductor package constituting the lower arm.

8. The semiconductor device according to claim 7, wherein a planar shape of the at least one semiconductor package is a rectangular shape, and the plurality of terminal blocks are arrayed obliquely with respect to sides of an outer shape of the at least one semiconductor package in plan view.

* * * * *